United States Patent [19]

Bert et al.

[11] 4,311,966
[45] Jan. 19, 1982

[54] DISTRIBUTED AMPLIFIER FOR MICROWAVE FREQUENCIES

[75] Inventors: Alain Bert; Didier Kaminsky; Gérard Kantorowicz, all of Paris, France

[73] Assignee: Thomson CSF, Paris, France

[21] Appl. No.: 100,481

[22] Filed: Dec. 5, 1979

[30] Foreign Application Priority Data

Dec. 5, 1978 [FR] France .................... 78 34224

[51] Int. Cl.³ ............................................ H03F 3/60
[52] U.S. Cl. .................................... 330/286; 330/54
[58] Field of Search ............... 330/53, 56, 57, 286, 330/54, 277, 307

[56] References Cited

U.S. PATENT DOCUMENTS 3,593,174  7/1971  White .................... 330/53
4,092,616  5/1978  Osterwalder .......... 330/53

Primary Examiner—James B. Mullins
Assistant Examiner—Gene Wan
Attorney, Agent, or Firm—Roland Plottel

[57] ABSTRACT

The amplifier comprises two input and output transmission lines connected together by means of a plurality of active quadripoles mounted in parallel across the transmission lines, the elements for matching the quadripoles being inserted between the lines. In a solid state design, the active quadripoles are formed in a gallium arsenide substrate and the lines are constituted by metallic deposits formed on the substrate by means of the microstrip technique. The matching elements comprise inductance coils between which are placed coupling capacitors.

2 Claims, 6 Drawing Figures

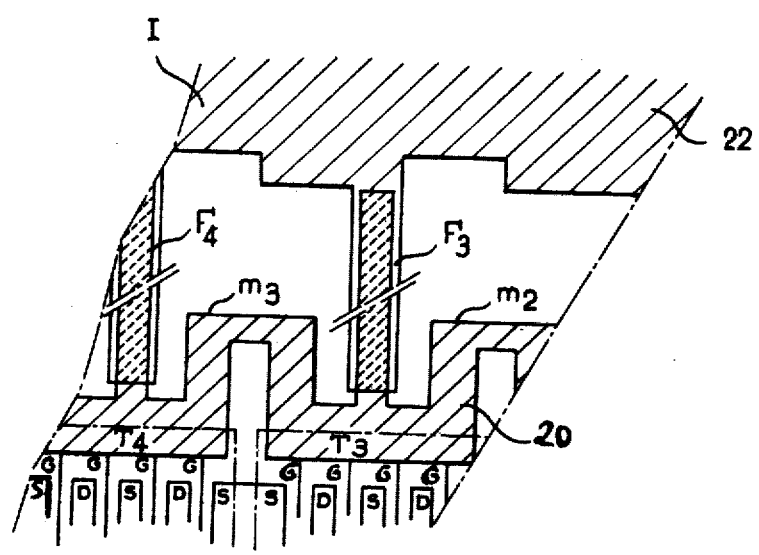
FIG_6

DISTRIBUTED AMPLIFIER FOR MICROWAVE FREQUENCIES

This invention relates to a distributed amplifier for microwave frequencies.

As a general rule, distributed amplifiers are constituted by two input and output transmission lines connected together through amplifying elements or active quadripoles which are all mounted in parallel with two poles connected to the input line and the other two poles connected to the output line. The power to be amplified which is applied to the input of the first line is distributed between the different amplifiers, the power outputs of which recombine to produce an amplified power at the output of the second line.

Amplifiers of this type are well-known in the prior art and make use of amplifying elements consisting especially of electron tubes or semiconductor amplifiers having a high input impedance such as field-effect transistors, for example, which can readily be integrated in systems for microwave transmission, especially in the X-band.

Amplifiers of this type have been described in the article by Edward L. Ginzton et al. entitled "Distributed Amplification" and published in "Proceedings of the I.R.E.", vol. 36 No. 8, August 1948, as well as in British Pat. No. 464,977. They have given rise to a very wide range of designs characterized by arrangements adopted for ensuring power distribution between the amplifiers at the input and recombination of applied powers at the output.

In all cases, however, aside from the question of power gain, one of the conditions governing the construction of amplifiers based on this principle is that of the possible operating-frequency band or bandwidth since the operation of these structures becomes rapidly impaired at frequencies in the vicinity of the mid-band frequency for which they are designed. Transformation of the impedances of each shunt circuit along the lines in fact changes to an appreciable extent with the frequency. In consequence, whereas regulation of the system as a whole proves satisfactory at the mid-band frequency, it is much less so at adjacent frequencies; this results in a limited bandwidth.

The aim of the invention is to provide a distributed amplifier in which, all other things being equal, the arrangement adopted makes it possible in particular to increase the width of the operating-frequency band.

In one of the design concepts of the prior art, the amplifying elements were each provided with their matching elements. Each shunt circuit comprised an amplifier, the impedance of which was matched in such a manner as to be considered from the input line on which it was mounted with a real impedance Zo as the characteristic impedance of the different sections of said input line; the same procedure was adopted for the output line; matching of each amplifier of the series was effected prior to assembly. When thus provided with its matching elements, each amplifier was then mounted at the predetermined points of insertion between the two transmission lines. A constructional arrangement of this type has been described in particular by White in U.S. Pat. No. 3,593,174 granted on July 13, 1971.

However, by proceeding in this manner, it seldom happens that the real value referred-to can be obtained with strict accuracy and in the same manner in the case of all the elementary amplifiers in spite of their natural dispersion. Matching is therefore not perfect even on the mid-band frequency, with the result that certain reflections are inevitable in the lines and affect the gain of the amplifier. Such conditions are made worse when departing from the mid-band frequency and have the effect of reducing the possible operating-frequency bandwidth.

According to the invention, the matching means aforementioned are no longer concentrated on the shunt-circuit legs as in this design concept and determined prior to connecting-up of the quadripoles, but form an integral part of the line sections located between them, both on the input side and on the output side. Accordingly, although this does not constitute a strictly scientific explanation, it may be noted that the effect produced by the lengths of line on the values of the matching elements outside the mid-band operating frequency in particular, can be less marked than in the design concept of the prior art already mentioned, precisely by reason of the fact that these elements are located at intervals on said line sections and not concentrated solely in the shunt circuits.

It will also be seen that, in certain forms of these distributed amplifiers in the solid state on a semiconductor substrate, construction of matching means on the aforementioned line sections is particularly straightforward in an integrated form.

A more complete understanding of the invention will be gained from the following description and from the accompanying drawings in which:

FIG. 6 is a fragmentary view of an alternative embodiment of the amplifier according to the invention and shown in the preceding figure.

FIG. 1 shows diagrammatically a portion of a distributed amplifier of the prior art which is limited to four consecutive quadripoles $Q_5$ $Q_6$ $Q_7$ and $Q_8$, for example.

Figure 1:
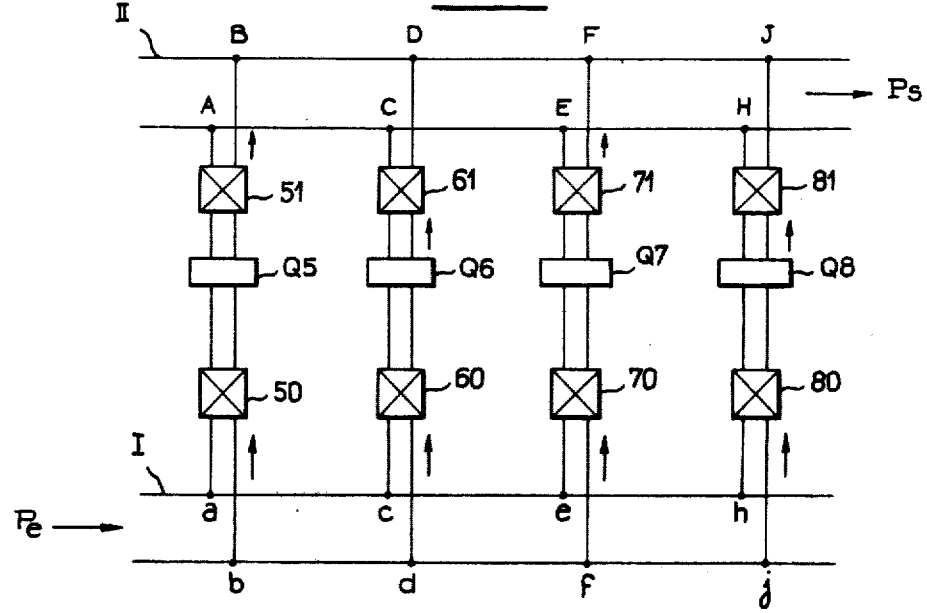
FIG. 1 is a diagram showing the insertion of the elementary amplifiers in a distributed amplifier of the prior art.

The Roman numerals I and II designate respectively the input and output lines of the distributed amplifier. The shunt circuits which carry the quadripoles are inserted between said lines at ab, cd, ef, hj in the case of the input line, and at AB, CD, EF, and HJ in the case of the output line. Each shunt circuit or branch is adapted to carry matching elements whose intended function is to convert the impedance of each quadripole both at the input and at the output of this latter to an impedance which is matched with the line impedance. The impedances under consideration are those which appear between the points a and b, c and d, e and f, h and j on the input side and A and B, C and D, E and F, H and J on the output side. These matching elements are designated by the reference numerals 50 and 51, 60 and 61, 70 and 71, 80 and 81 and are represented by crossed rectangles. It will be understood that the impedance which appears both at the input and at the output between terminals such as a, b and A, B results from the presence of said matching elements in addition to the lengths of line which connect said elements to said terminals and, as is well-known, cannot be overlooked in the case of microwave frequencies.

The signal which is to be amplified and has a power level $P_e$ is applied to the input of the line I on the left-hand side of the figure, propagates in the direction of the arrow shown at the bottom of the figure and is distributed along said line between the different shunts (vertical arrows).

The amplified signal having a power level $P_s$ propagates in the direction of the right-hand arrow at the top of the figure towards the output of line II.

In accordance with an arrangement commonly utilized in the prior art, the lines themselves consist of sections which all have solely a real impedance and the matching elements are chosen so as to ensure that the impedances appearing at the insertion points (a,b, A,B, etc.) are also real impedances.

It will accordingly be apparent from the foregoing that, if equidistribution of power between the quadripoles is added as a generally accepted condition in which said quadripoles each receive the same fraction of the input power $P_e$, said line sections or in other words the portions located on line I between the points hj and ef, ef and cd, cd and ab and then beyond to the left must have characteristic impedances of decreasing value towards the left; this decrease will take place towards the right in the output line. By way of example in the case of the figure and assuming for the sake of evaluation that provision is made only for the four quadripoles shown and postulating a real impedance at hj equal to 100 ohms, that section of the line I which is located between the points hj and ef will be chosen as a characteristic impedance equal to 100 ohms; the line section located between ef and cd will be chosen as a characteristic impedance of only 50 ohms if it is desired to have equal power levels at the inputs of the quadripoles 8 and 7; whilst the line section between cd and ab will be chosen so as to have an impedance of 33 ohms; the following section would have an impedance of 25 ohms and so forth. In the output line, these values would be distributed in the reverse order between AB and CD, CD and EF, and EF and HJ. The output power is $P_s = G P_e$, where G is the value of the gain of one quadripole and is substantially the same for all quadripoles.

The foregoing details have been given in order to provide a clearer definition of the problem although the conditions mentioned, especially the equality of power levels at the input of each active quadripole, need not be considered as essential.

Be that as it may, the difficulty which has already been emphasized lies in the need for strictly pre-established values prior to assembly of the quadripoles on the lines and this remains essential irrespective of the law of decrease adopted, only one example of which has been given above. Deviations from the desired values cause reflections on the lines which cannot usually be corrected since no provision is made for any additional matching means on the lines themselves.

Figure 2:
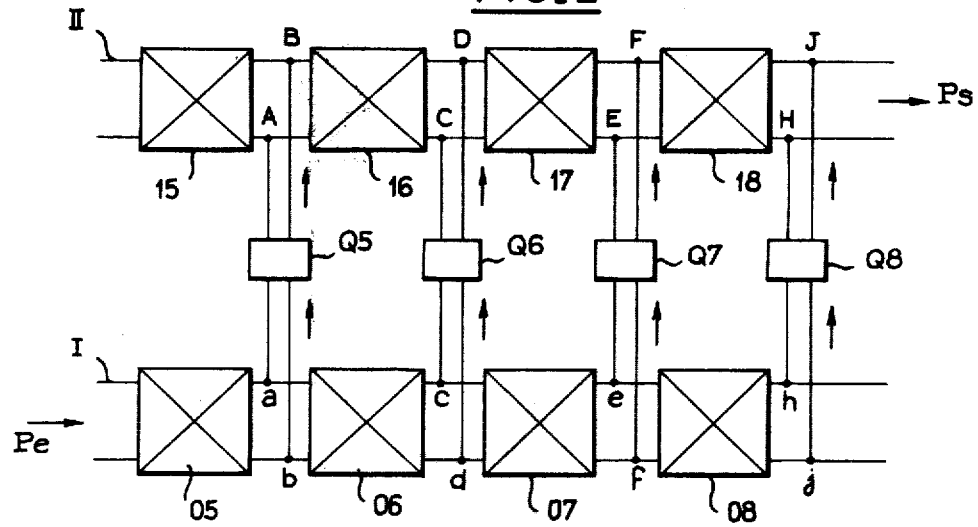
FIG. 2 is a diagram which is similar to the preceding figure and shows a distributed amplifier according to the invention.

In the present invention, on the contrary, all the matching means form part of the lines themselves and are adjusted at the time of constuction of said lines. The corresponding diagram is accordingly that of FIG. 2 in which these matching means are incorporated in the propagation lines both at the input and at the output, the same four quadripoles as in the preceding example being designated by the references 05 to 08 and 15 to 18.

In the structures of the invention, the elementary amplifiers are integrated with resonators and said resonators are coupled to each other in a number of different arrangements.

Figure 3:
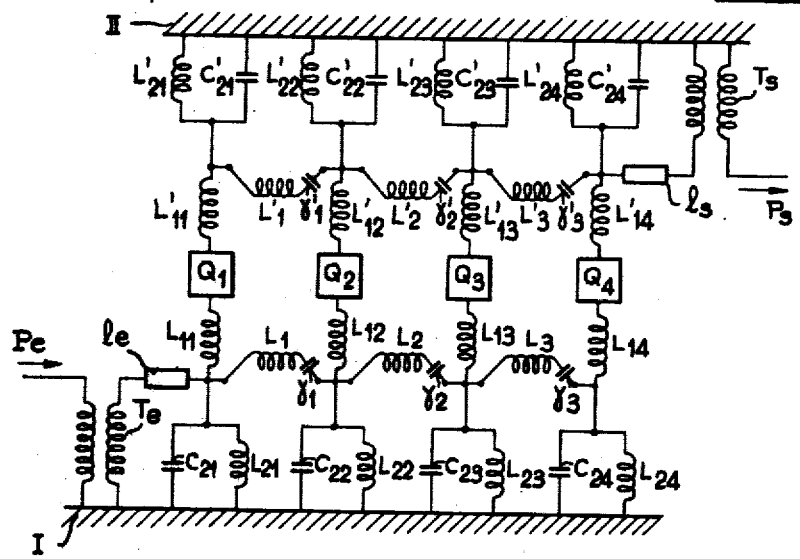
FIG. 3 is the equivalent circuit diagram of one example of distributed amplifier according to the invention.

FIG. 3 is the equivalent diagram of one example of a distributed amplifier according to the invention in which provision is made for four quadripoles. The input and output impedances of the amplifier quadripoles of this example are equivalent to RC resistance-capacitance circuits as is the case with field-effect transistors. Together with the elements $L_{11}$, $L_{21}$, $C_{21}$ (in the case of the first cell), $L_{12}$, $L_{22}$, $C_{22}$ (in the case of the second cell), $L_{13}$, $L_{23}$, $C_{23}$ (in the case of the third cell) and so forth, the input impedances form resonators which are coupled to each other through the elements $L_1$, $\gamma_1$, $L_2$, $\gamma_2$, $L_3$, $\gamma_3$. Similarly, the output impedances form resonators with the elements $L'_{11}$, $L'_{21}$, $C'_{21}$ (in the case of the first cell), $L'_{12}$, $L'_{22}$, $C'_{22}$ (in the case of the second cell), $L'_{13}$, $L'_{23}$, $C'_{23}$ (in the case of the third cell) and so forth, said resonators being coupled to each other through the elements $L'_1$, $\gamma'_1$, $L'_2$, $\gamma'_2$, $L'_3$, $\gamma'_3$.

There are also shown in the diagram two impedance transformers and line sections which are represented by rectangles and may prove necessary, in accordance with known practice in the field of microwave transmission, in order to match the entire device at the input and at the output. These elements are designated by the references $T_e$, $1_e$ and $T_s$, $1_s$.

Figure 4:
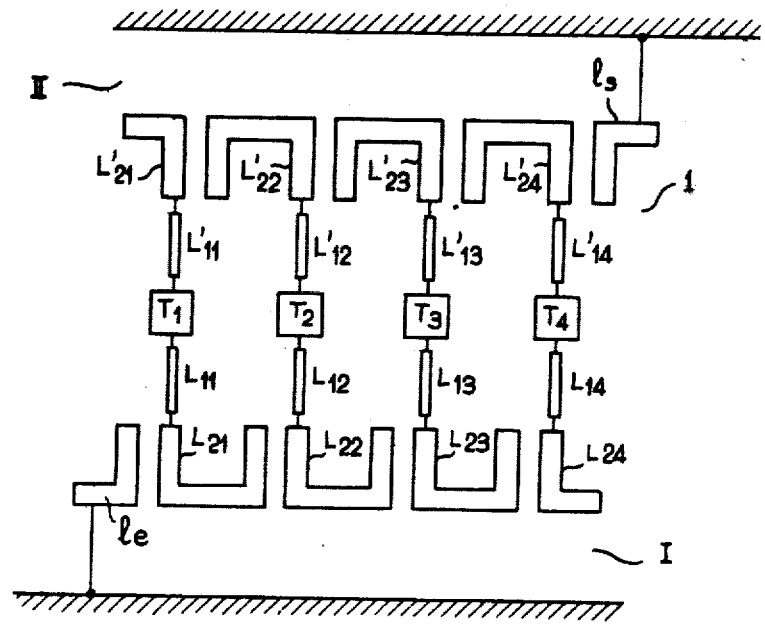
FIG. 4 is a plan view of a distributed amplifier according to the invention in the solid state and in the microstrip technique.

FIG. 4 shows one embodiment of a four-quadripole distributed amplifier according to the invention in a hybrid version in which the amplifier quadripoles are transistors $T_1$, $T_2$, $T_3$, $T_4$. Said transistors are prepared separately and mounted on an insulating substrate 1 which carries the lines and these latter are formed in accordance with the "microstrip" technique in which said lines are constituted by conductors applied against one face of the substrate and by the oppositely-facing portions of a conductive electrode applied against the opposite face of said substrate. If the coupled lines have lengths in the vicinity of one-quarter of the wave-length of the mid-band frequency, it can be shown that this arrangement is electrically equivalent to the diagram of FIG. 3; each coupling ensures reversal of impedance in accordance with principles which are known in the art of construction of band-pass filters of this type. Said lines are connected to the transistors by means of conductors formed for example by thermocompression and designated by the same references $L_{11}$ to $L_{14}$ and $L'_{11}$ to $L'_{14}$ as in the preceding diagram. The capacitances of the transistors have not been shown in the figure and are included in the represenation of these latter. A coupled line completes the device both at the input and at the output as designated by the references $1_e$ and $1_s$.

It will be noted that the structure which has been described in the foregoing is none other than a band-pass filter structure but the filters of this structure have a characteristic feature in that they are provided with active elements distributed along their length, the first active element being connected to the input of each filter and the last active element being connected to the output. This filter structure results from coupling of the resonators which, in accordance with the invention, are associated with the active quadripoles.

Figure 5:
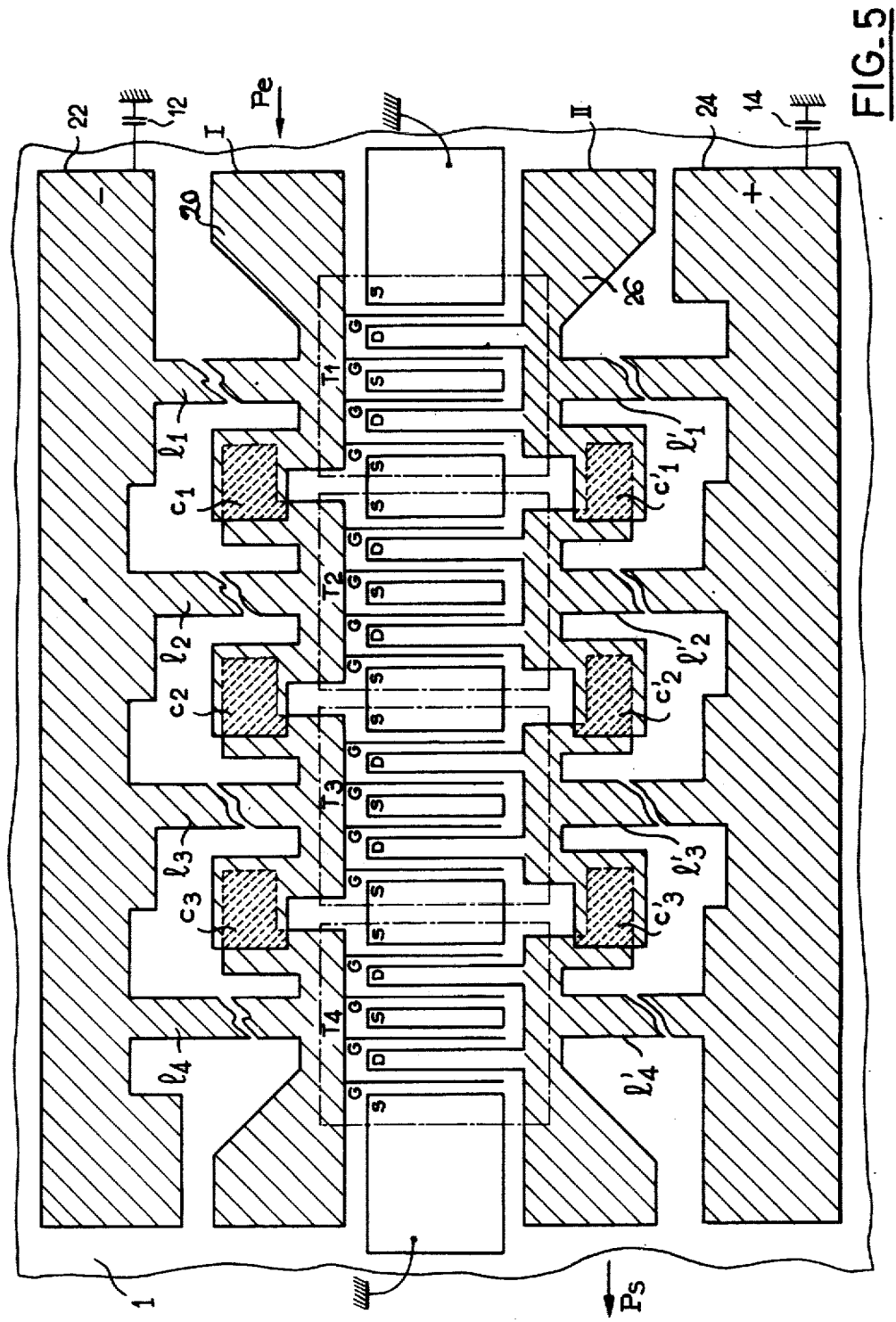
FIG. 5 shows one example of construction of the distributed amplifier according to the invention in single-unit form.

FIG. 5 shows one example of a microwave distributed amplifier according to the invention and fabricated in the solid state in monolithic form in the microstrip technique which, as already mentioned, entails the use of metallic deposits on an insulating substrate as line elements.

In this monolithic construction which is shown in a plan view in the figure, the amplifiers are field-effect transistors formed in a semi-insulating substrate of gallium arsenide (GaAs) and are equivalent to RC circuits, the sources, gates and drains of said transistors being designated respectively by the letters S, G and D. In the example shown, provision is made for four amplifiers limited to the squares $T_1$, $T_2$, $T_3$, $T_4$ as shown in chain-dotted outline.

The gates of said transistors are connected to a first conductive deposit 20 forming part of the input line I and adjacent to the zone of implantation of the transistors in the substrate. The drains of said transistors are connected to a second conductive deposit 26 forming part of the line II and adjacent to the implanted zone of the other side. These deposits consist of microstrips as already mentioned in connection with the preceding figure.

Inductances are provided in the form of microstrips located at right angles to the preceding and in contact therewith. Said microstrips extend from the portions 20 and 26 to two other portions 22 and 24 which are parallel thereto and constitute the contact strips of the lines I and II. During operation, said lines are connected to the direct-current supplies (not shown) by means of said portions 22 and 24 under the known conditions of the techniques involved in the circuits of this type. Said contact strips are coupled at high frequency to the ground of the system through the capacitors 12 and 14, the ground being that of a conductive electrode which is subjacent to the substrate and is not shown in the drawing. The sources of the transistors are connected to said ground. The conductive portions are shown as hatched or shaded areas in the drawing for the sake of enhanced clarity.

Between the resonators thus formed and associated with each amplifier, a capacitive coupling is established by providing microstrips 20 and 26 which are interrupted at certain points between the inductances and formed in this portion by two conductive deposits placed one above the other and separated by a layer of insulating material (thin hatchings in dashed lines). The inductances are designated in the figure by the references $l_1$, $l_4$ and $l'_1$, $l'_4$ and the coupling capacitors are designated by the references $c_1$ to $c_3$ and $c'_1$ to $c'_3$ in the case of the input and output lines respectively. The photoetching technique is adopted for all the deposits thus formed.

There is thus obtained a monolithic structure which covers the gallium arsenide crystal over a rectangular surface area of 600 microns in the direction of propagation and 1200 microns in the perpendicular direction. Said structure is capable of operating within an octave band in the vicinity of 8 gigahertz and delivers a power of more than one watt with four field-effect transistors having a gain of 6 dB.

In an arrangement which would be equivalent to that of FIG. 5 and would also come within the scope of the invention, the positions of the inductance elements and of the capacitance elements of this figure would be reversed as indicated in the fragmentary view of FIG. 6 in which two of said inductance elements and two of said capacitance elements are shown without any indication of polarity.

As in the previous figure, the capacitance elements designated in this case by the letter F ($F_{3,4}$ in the fragmentary view) are represented by surfaces shown as thin dashed-line hatchings. In regard to the inductance elements $m_2$, $m_3$, said elememts are formed by re-entrant portions of the conductor 20.

Two alternative embodiments of the distributed amplifier according to the invention have been described in the foregoing solely by way of example without any limitation being implied. All other alternative forms derived from said embodiments and within the capacity of anyone versed in the art also come within the scope of the invention.

The microwave amplifier according to the invention finds an application in devices for power amplification of microwave-frequency electric signals in the X-band, and in devices for emission and reception of wide-band microwave-frequency signals.

What is claimed is:

1. A distributed amplifier for microwave frequencies comprising two input and output transmission lines, that is an input line connected to an hyperfrequency power source, and an output line connected to a load, and a plurality of active quadripoles mounted in shunt with two poles connected to the input line and the two other poles connected to the output line, and means for matching said quadripoles with each transmission line, said matching means being constituted by portions of the lines themselves, and the impedances at the terminals of said transmission lines, opposite the source and the load, respectively consisting of the input impedance and the output impedance of the farthest among the quadripoles of said plurality, wherein the active quadripoles consist of field-effect transistors formed in side-by-side relation in a zone of one of the faces of a semi-insulating substrate, wherein the transmission lines are constituted by conductive deposits formed on said face and on the oppositely-facing portions of a conductive electrode which covers the opposite face of said substrate, wherein the input line comprises aligned conductive deposits connected to the transistor gates and the output line comprises further aligned conductive deposits on the other side of said zone and connected to the transistor drains, wherein the reactances are inductance elements consisting of conductive strips directed at right angles to said aligned deposits and in contact with said deposits at one end thereof, said strips being interconnected at the other end by means of a conductor deposited on the substrate which extends in a direction parallel to said aligned deposits, and wherein the coupling elements consist of capacitors placed between the inductance elements and formed by the superposed ends of two consecutive deposits, said ends being separated by a layer of insulating material placed in contact therewith.

2. A distributed amplifier for microwave frequencies comprising two input and output transmission line, that is an input line connected to an hyperfrequency power source, and an output line connected to a load, and a plurality of active quadripoles mounted in shunt with two poles connected to the input line and the two other poles connected to the output line, and means for matching said quadripoles with each transmission line, said matching means being constituted by portions of the lines themselves, and the impedances at the terminals of said transmission lines, opposite the source and the load, respectively consisting of the input impedance and the output imedance of the farthest among the quadripoles of said plurality, wherein the active quadripoles consist of field-effect transistors formed in side-by-side relation in a zone of one of the faces of a semi-insulating substrate, wherein the transmission lines are constituted by conductive deposits formed on said face and the oppositely-facing portions of a conductive electrode which covers the opposite face of said substrate, wherein the input line comprises aligned conductive deposits connected to the transistor gates and the output line comprises other aligned conductive deposits on the other side of said zone and connected to the transistor drains, wherein the reactances are inductance elements constituted by the end portions of two consecutive conductors connected together away from said aligned deposits so as to form a loop, and wherein the coupling elements consist of capacitors placed between the inductance elements and formed by conductive strips directed at right angles to said aligned deposits and in contact with said deposits at one end thereof and by other strips placed above the strips aforesaid and separated therefrom by a layer of insulating material, said other strips being connected together by means of a conductor deposited on the substrate and extending in a direction parallel to said aligned deposits.

* * * * *